United States Patent [19]
Launay et al.

[11] Patent Number: 5,850,690
[45] Date of Patent: *Dec. 22, 1998

[54] METHOD OF MANUFACTURING AND ASSEMBLING AN INTEGRATED CIRCUIT CARD

[75] Inventors: François Launay, Caen; Jacques Venambre, Ifs, both of France; Jan Severin, Waalre; Harry Van Noort, Veldhoven, both of Netherlands

[73] Assignee: De La Rue Cartes et Systemes SAS, Paris, France

[ * ] Notice: This patent issued on a continued prosecution application filed under 37 CFR 1.53(d), and is subject to the twenty year patent term provisions of 35 U.S.C. 154(a)(2).

[21] Appl. No.: 677,001

[22] Filed: Jul. 8, 1996

[30] Foreign Application Priority Data

Jul. 11, 1995 [FR] France ................................. 95 08369

[51] Int. Cl.⁶ ........................... H05K 3/34; H05K 13/04; H01L 21/56; H01L 23/28
[52] U.S. Cl. ............................. 29/841; 29/827; 29/840; 29/852; 174/52.2; 228/180.21; 235/492; 257/679; 264/272.15; 264/272.17; 361/764
[58] Field of Search ........................... 29/827, 829, 840, 29/841, 852; 174/52.2; 228/180.21; 235/488, 492; 257/679; 264/272.11, 272.14, 272.15, 272.17; 361/761, 764

[56] References Cited

U.S. PATENT DOCUMENTS

| | | | |
|---|---|---|---|
| 3,714,709 | 2/1973 | Liederbach | 29/841 |
| 4,495,232 | 1/1985 | Bauser et al. | 428/41 |
| 4,578,573 | 3/1986 | Flier et al. | 29/841 X |
| 4,674,175 | 6/1987 | Stempfli | 29/841 X |
| 4,725,924 | 2/1988 | Juan | 29/841 X |
| 4,855,868 | 8/1989 | Harding | 174/52.2 X |
| 4,859,632 | 8/1989 | Lumbard | 264/272.11 X |
| 4,881,029 | 11/1989 | Kawamura | 29/827 X |
| 5,013,900 | 5/1991 | Hoppe | 235/492 |
| 5,264,990 | 11/1993 | Venambre | 361/761 |
| 5,283,423 | 2/1994 | Venambre et al. | 235/492 |
| 5,438,750 | 8/1995 | Venambre | 29/829 X |

FOREIGN PATENT DOCUMENTS

| | | | |
|---|---|---|---|
| 0201952 | 11/1986 | European Pat. Off. | |
| 0424530A1 | 5/1991 | European Pat. Off. | |
| 2520541 | 7/1983 | France | |
| 2548857 | 1/1985 | France | |
| 2580416 | 10/1986 | France | |
| 9407308 | 6/1994 | France | |
| 2020032 | 1/1990 | Japan | 29/841 |
| 4032243 | 2/1992 | Japan | 29/841 |
| 657680 | 4/1979 | U.S.S.R. | 29/841 |
| 2047474 | 11/1980 | United Kingdom | |

*Primary Examiner*—Peter Vo
*Attorney, Agent, or Firm*—Oliff & Berridge, PLC

[57] ABSTRACT

In a first step, electrical conductor tracks (15 to 20) are applied against the bottom and the walls of a cavity (5) for the integrated circuit (IC4) and connected to external contact pads (2) at the same side of the card. Said tracks lie alternately side-by-side at the bottom 7 of the cavity. In a second step, the IC (4) is glued with its surface which does not carry the contacts on said tracks on the bottom (7) of the cavity by means of a non-conducting glue. Then connections are realized by soldering of conductor wires (12) between contacts of the IC and ends of the tracks, and the cavity is filled with a protective resin. Application: Placement of an IC with inverted contacts in an electronic card support.

4 Claims, 3 Drawing Sheets

METHOD OF MANUFACTURING AND ASSEMBLING AN INTEGRATED CIRCUIT CARD

BACKGROUND OF THE INVENTION

Description

The invention relates to a method of manufacturing and assembling an electronic card comprising an electrically insulating card support provided with a cavity for accommodating an integrated circuit and, on one surface, metal contact pads electrically connected to contacts of said integrated circuit, comprising the following steps:

- a first step in which electrical conductor tracks are provided by an MID (Moulded Interconnection Devices) technology, all said tracks being applied against the bottom and the side walls of said cavity and each connected to one of said metal contact pads arranged on the surface of the support which comprises said cavity,
- a second step in which the integrated circuit is fixed with its surface which does not comprise the contacts to the bottom of the cavity by means of gluing,
- a third step in which electrical connections are realized by soldering of conductor wires between the contacts of the integrated circuit and the ends of the corresponding conductor tracks,
- a fourth step in which the cavity is filled with a protective resin which is subsequently polymerized.

The invention also relates to the electronic card obtained by this method.

The integrated circuit (or chip) inserted into the cavity of the support may be an electronic memory or a microprocessor of a surface area greater than that of the simple memory.

A technology in present use for the realization of chip cards mentioned here by way of prior art consists in the use of a printed circuit deposited on a support film, usually made of epoxy glass, polyimide, or polyester, as described, for example, in European Patent EP 0 201 952 B1 in Applicant's name (PHF 85.533). The use of a moulded leadframe is also known. The support film or the leadframe carries the metal pads for external contacting of the card on one of the surfaces; the other surface serves to support the electronic chip which is electrically connected to the external contacts through the film or leadframe The material of the support film and the material used for moulding the grid are insulating so as to insulate the external contacts and the internal connections of the electronic chip electrically from one another.

The assembling operation of the chip card accordingly comprises:

- gluing of the integrated circuit (chip) on the internal surface of the film or leadframe,
- realization of the electrical connections between the chip contacts and the metal pads for external contacting (by means of conductor wires),
- protecting the chip and the connections by means of a protective resin,
- cutting the electronic module thus formed so as to separate it from the support film or leadframe,
- insertion and gluing of the module in a card support made of a synthetic resin material (usually PVC, ABS, or polycarbonate) in which a holder cavity has been previously realized for receiving the module with its side which supports the integrated circuit (chip). This cavity may be realized by injection-moulding or by spot facing.

These technologies have several disadvantages:

- the operation of protecting the chip is a delicate one because the thickness of the resin must be carefully controlled and limited.
- the insertion of the electronic module into the card is subject to very narrow tolerances as to planeness and positioning, and gluing must be very effective so as to satisfy torsion and bending test requirements.

To eliminate these disadvantages, Applicant prefers to use the technology defined in the opening paragraph and further described in a French Patent Application not yet published and filed under No. 94 07 308 on 15 Jun. 1994 (PHF 94.534) entitled: "Manufacturing and Assembling Method for an Integrated Circuit Card, and Card Obtained Thereby". In this new technology, a film or leadframe supporting the metal contact pads on one surface is no longer necessary, only two elements remaining: the card support and the integrated circuit. Apart from the omission of this intermediate module, the number of process steps for manufacturing and assembling an integrated circuit card is reduced and the mechanical positioning constraints for the metal pads for external contacting on the card are eliminated. Another advantage of this novel technique is that it permits of controlling the degree of recessing of the circuit in the thickness of the card and that the average position of the contacts lies closer to the zero line, at half the support thickness, than in the present technology with modules, which is favorable for adequately resisting bending and torsion influences on the card.

Another difference between the two technologies is that the integrated circuits occupy reverse positions relative to the electronic card assembly depending on whether the one or the other of these technologies is used. If the new technology indicated in the opening paragraph is to be implemented in a simple manner, an integrated circuit should accordingly be used which is specially adapted thereto, i.e. a circuit symmetrical with respect to a plane of a circuit which is commercially available and which is compatible with conventional, widely used techniques in which a module is used. The technical problem to be solved by the invention is exactly how to adapt the above new technology to commercially available integrated circuits for their use in a normal electronic card with module.

SUMMARY OF THE INVENTION

This object is achieved in a first preferred embodiment of the invention owing to the fact that the manufacturing and assembling method described in the opening paragraph is characterized in that, during the first step, the conductor tracks traverse the entire bottom of the cavity whereon they lie alternately side-by-side such that their ends are arranged in an inverted configuration with respect to that of the respective contact pads to which they are connected and in that, in the second step, the integrated circuit is glued by means of a non-conducting glue on these tracks.

This embodiment is suitable when integrated circuits are used whose contacts (including the ground contact) are provided at one and the same side of the component. There will thus be no risk of short-circuits between tracks below the integrated circuit in the gluing zone thereof.

In this first embodiment, it may happen that a better definition is necessary in the zone where the tracks lie alternately side-by-side than in other zones; it is then advantageous to introduce between the first and the second step a supplementary step consisting in the completion of the configuration of the tracks at least in this central zone at the cavity bottom by means of an etching operation with a fixed or mobile laser beam.

A second embodiment of the invention is characterized in that during the first step the ends of the tracks situated alternately opposite the one and the other side of the cavity bottom are offset in the direction of two diagonally opposed corners of the cavity bottom such that in the third step the conductor wires have an interdigital configuration above the surface of the integrated circuit which carries the contacts.

To implement this second embodiment it is advantageous when the card support comprises a cavity of two levels of depth, i.e. a pheripheral ledge at an intermediate level which carries the ends of the conductor tracks and a central, deeper level on which the integrated circuit is glued. The risk of a conductor touching the upper edge of the integrated circuit during the third step of soldering the connection wires, which would be an inacceptable electrical fault, is thus diminished.

Advantageously, the first step of applying the electrically conducting tracks comprises the cutting and gluing under hot pressure of the tracks provided with a hotcuring glue (hot foil embossing).

BRIEF DESCRIPTION OF THE DRAWING

The following description given by way of example, to which the invention is not limited, and with reference to the annexed drawings will render it clear how the invention may be implemented.

The same elements having identical functions are indicated with the same reference numerals in the various Figures.

DESCRIPTION OF THE PREFERRED EMBODIMENTS

Figure 1:
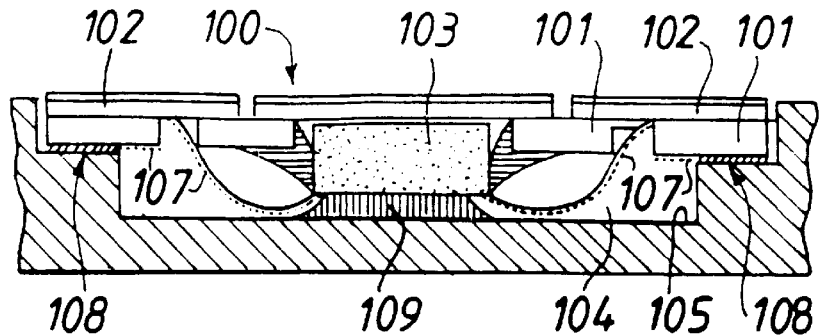
FIG. 1 is a cut-out cross-sectional view of an electronic card according to the prior art with module.

FIG. 1, an electronic card comprises a module 100 with a circuit support film (101, 102) and an integrated circuit 103 fixed in a cavity 104, which integrated circuit 103 is arranged against a bottom surface of the support film (101, 102) such that the integrated circuit lies inside the cavity 104 and its contacts face the bottom 105 of the cavity 104. The circuit 103 is glued in conventional manner on the support film (101, 102), and connection wires 107 are soldered between the contacts of the integrated circuit 103 and the support film (101, 102), the latter having conductive layers which form metal contact pads which are to cooperate with a card reader. The support film here comprises a conductive layer 102 in the form of a copper foil on which a Ni layer has been electrochemically deposited, followed by an Au layer and an insulating layer 101, which assembly forms a flexible support. A more detailed description of the construction of the module 100 can be found in French Patent Application FR 2,580,416 filed on Dec. 4, 1995.

The module 100 obtained after cutting is turned over and glued in the cavity 104 in location 108. A double-sided peel-off adhesive may be used in location 108 as described in the cited FR 2,580,416, which peel-off layer may serve as a mask for a protective lacquer. Finally, gluing takes place at 109 by means of a layer of polyurethane resin, which is comparatively hard, so that a satisfactory mechanical rigidity of the assembly is obtained.

Figure 2:
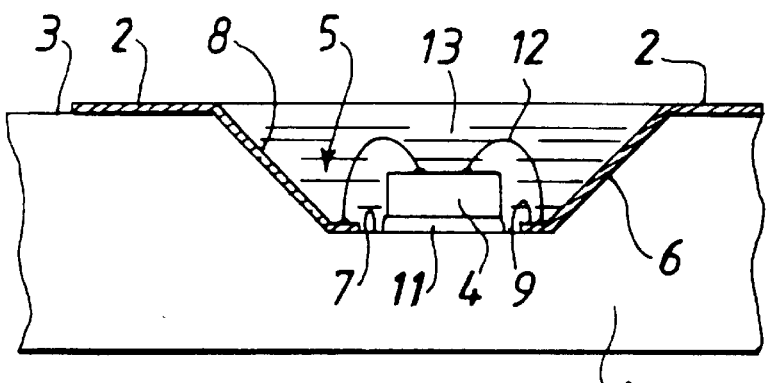
FIG. 2 is a cut-out cross-sectional view and FIG. 3 a cut-out plan view of an electronic card according to the prior art in which the novel technology is used, without module.
Figure 3:
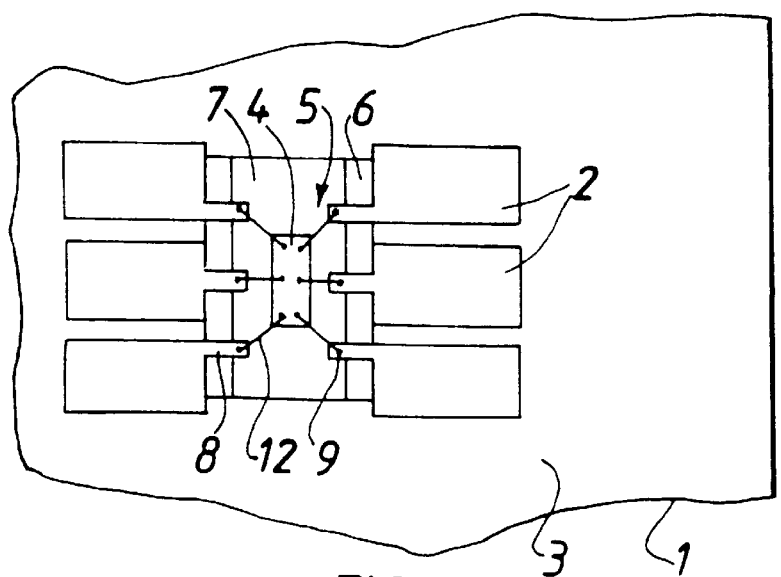

A novel assembling technique renders it possible to omit the intermediate stage of making the module as shown in FIGS. 2 and 3, which represent the active parts of an electronic card where the metal contact pads are present for cooperation with the probes of a card reader. The card support 1 comprises these pads 2, of standardized dimensions and positions, on a surface 3 (upper surface) of the card. The metal pads are electrically connected, at least some of them, to the contacts of an integrated circuit (or chip) 4 which is accommodated within the thickness of the body or card support 1.

To implement the method mentioned in the opening paragraph, the support 1 comprises a cavity 5 with lateral walls which are preferably inclined at an angle of approximately 45°, such as walls 6, while the bottom 7 is designed to receive the integrated circuit chip 4, while conductor tracks 8 (also called metallization lines) electrically connected to the pads 2 extend from the surface 3 of the card body up to the bottom 7 of the cavity where their respective free ends 9 are present, passing over the lateral walls of the cavity 5 which they traverse. The cavity 5 must have a depth less than 600 $\mu$m so as to leave a sufficient synthetic-resin thickness at the bottom of the card for avoiding fracture of this card bottom and for protecting the electronic chip. Various processes may be used for applying the tracks 8, substantially made of copper, on the support 1 which is preferably manufactured with its cavity 5 by injection-moulding from a thermoplastic material such as ABS, or polycarbonate. Some of these preferred processes will be described below. There is also a choice from various processes for realizing electrical connections between the contacts of the integrated circuit positioned in the cavity and the conductor tracks at the bottom of the cavity. A classical method shown in FIG. 2 consists in mounting of the integrated circuit 4 glued by its base by means of a polymerizable glue layer 11, usually an epoxy glue, against the bottom of the cavity 5, followed by soldering of the conductor wires 12, for example made of gold or aluminium, between the contacts of integrated circuit 4 and the ends 9 of the conductor tracks. Various mounting and wiring methods for the integrated circuit are known to those skilled in the art and are described in numerous publications, among which may be cited the patents FR 2,439,438; FR 2,548,857; EP 0,116,148; FR 2,520,541. For such a mounting process, with the base of the integrated circuit forming the ground contact, it is so arranged that an end of a track occupies the central position in the bottom of the cavity (not shown in FIG. 2) and that this metallized base is glued there by means of a conductive glue, for example a glue filled with 70% silver by volume. The gluing operation may be carried out with glues and equipment which are conventionally used in the semiconductor industry (types KS, ESSEC, or others). The mounting process shown in FIG. 2 is that in which the integrated circuit possesses all its contacts, including the ground contact, on one and the same side (the upper side in FIG. 2).

Gold or aluminium wires may be used for the wiring through soldering of conductor wires, the gold wire being preferred for reasons of speed (the thermosonic process used for soldering gold wires is 3 to 4 times quicker than the soldering of aluminium wires). This operation is the most delicate one in the assembling process because it involves preheating of the plastic support. Since it is undesirable for this preheating to exceed the glass transition temperature Tg of the plastic support (deformation risk), it is preferable to use cards made of materials having a high Tg (polycarbonate, ABS, ABS-PVC composites, or ABS-polycarbonate composites).

After mounting and gluing of the chip, the operation of filling the cavity 5 may be realized by a simple potting process, which consists of the deposition of a drop of resin 13 into the cavity 5. To obtain a plane external surface, resins of very low viscosity are preferably used, such as, for example, resin No. 931-1 from the American firm of ABLE-STICK. This resin must have a high ionic purity and have a good resistance to water absorption so as to protect the electronic chip effectively in climatic tests. After being applied in the cavity the resin is polymerized, which forms the final step in the process of manufacturing and assembling the electronic card in which no intermediate module is used.

Figure 5:
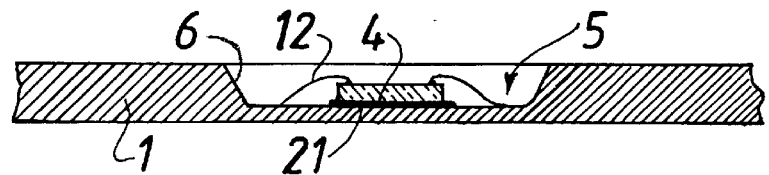
FIGS. 4 and 5 show a first embodiment of the invention, FIG. 4 in cut-out plan view and FIG. 5 in cut-out cross-section.
Figure 4:
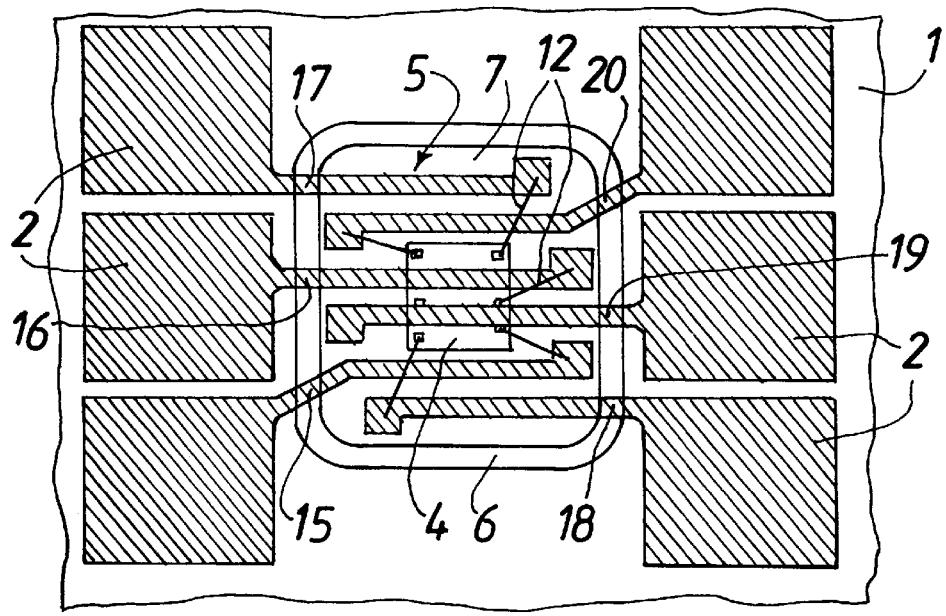

In comparing FIGS. 1 and 2, it is to be noted that the integrated circuit 4, FIG. 2, occupies a position rotated through 180° relative to that of the integrated circuit 103 of FIG. 1. In fact, the contacts of the integrated circuit and the metal pads, instead of facing in mutually opposite directions as in FIG. 1, now face in the same direction, i.e. they face upwards in FIG. 2. Given the fact that each metal pad is designed and standardized for being connected to a particular contact of the integrated circuit, because of the cooperation of the card with a reader, it follows that the integrated circuits 103 (FIG. 1) and 4 (FIGS. 2 and 3), even though having the same basic structure and the same functions, are not identical because there is a permutation or inversion between left and right as regards their contacts. The invention now has for its object to implement the technology described with reference to FIGS. 2 and 3 while using a mass-manufactured component such as 103, FIG. 1. A solution to this problem consists in an interdigital arrangement of the conductor tracks on the bottom of the cavity 5 as shown in FIGS. 4 and 5, whereby the ends of the tracks 15, 16 and 17 continue from the left to the right over the bottom of the cavity 5, and vice versa for the tracks 18, 19 and 20. The inversion of the contacts mentioned above is thus compensated for, which inversion would otherwise have had to be applied on the printed circuit in order to apply the technology of FIGS. 2 and 3 directly. Such an operation, however, presents two particularities:

It will be noted in the first place that it is necessary to glue the integrated circuit partly on metal tracks for its fixation against the card support, in contrast to the situation shown in FIGS. 2 and 3. It is accordingly necessary for the embodiment of FIGS. 4 and 5 to use an integrated circuit of which all contacts are provided at the same side. Moreover, the glue used must not cause short-circuits between tracks nor between track and integrated circuit. An insulating glue which is suitable for fixing the integrated circuit, referenced 21 in FIG. 5, is an epoxy-type glue, for example, type D125F supplied by the GRACE Company (formerly Emerson & Cuming), or alternatively the insulating glue ABLESTICK 931-1, which polymerizes in 6 minutes at 120° C. and which is manufactured by the American company of ABLESTICK, part of the National Starch and Chemical Company, 20021 Susana Road, Rancho Dominguez, Calif. 90021.

A second particularity of the first embodiment of the invention shown in FIGS. 4 and 5 is that a high resolution may be required for the tracks because of their interdigital arrangement on the bottom of cavity 5. In the example of FIG. 4, where six tracks only are alternately arranged, a MID (Moulded Interconnection Devices) technology yielding a resolution of 250 μm between tracks is sufficient. For this purpose, the hot foil embossing technique is preferred, i.e. cutting and gluing under hot pressure of tracks provided with a hot-curing glue. It is also possible to apply a catalyst in the configuration desired for the tracks on the card support by printing, and subsequently to realize a metallization in the desired locations through autocatalysis.

Figure 6:
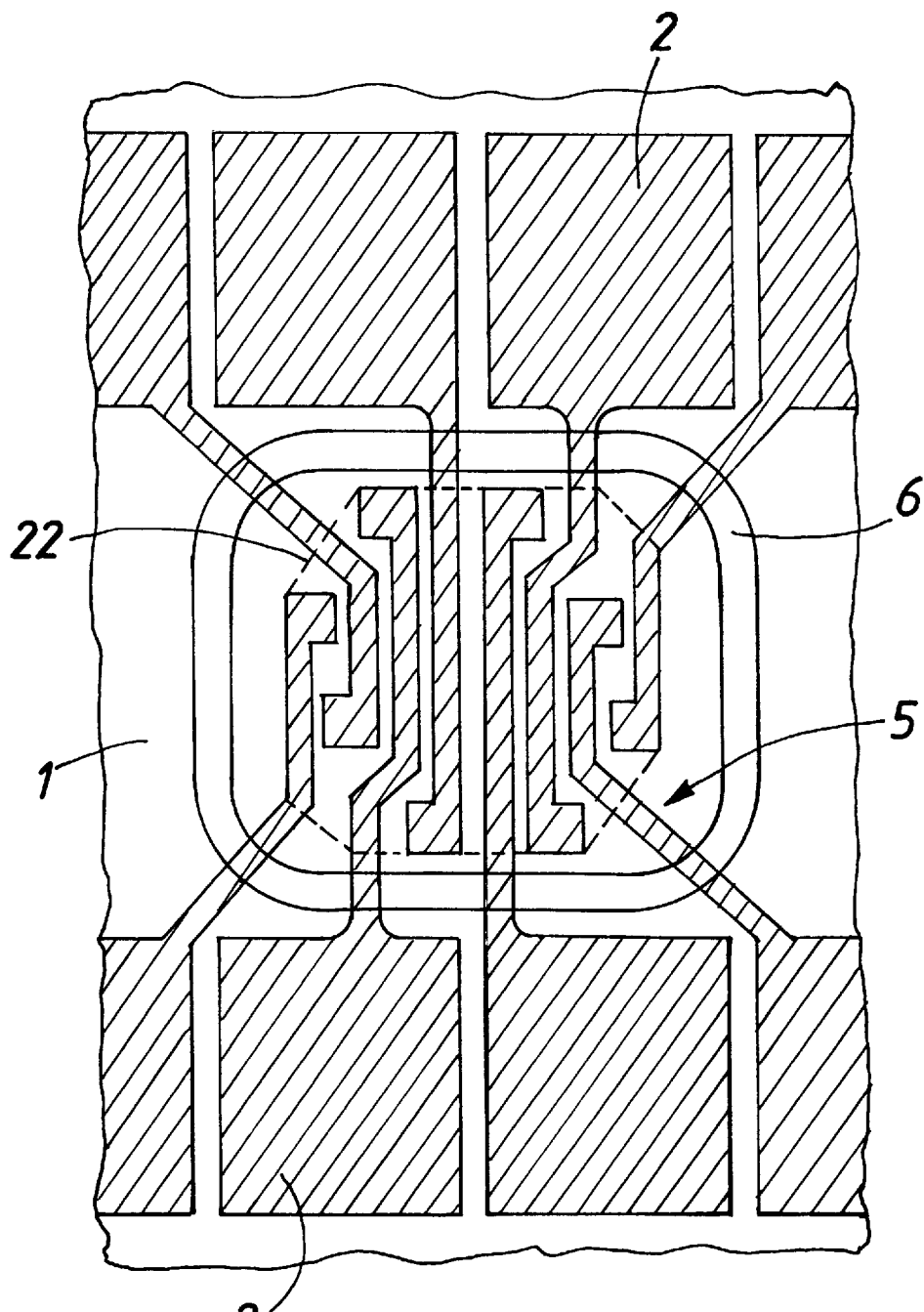
FIG. 6 shows in cut-out plan view a modification of the first embodiment of the invention.

However, an even finer resolution may be necessary, for example of 100 μm between tracks, especially in the case where eight tracks lie side by side as shown in FIG. 6. In such a case, the first step in applying the tracks may be split up into two sub-steps: a first sub-step as described in the preceding paragraph in locations where a fine resolution is not required and which leads to a metallization of the major portion of the bottom of the cavity 5, for example the portion situated within the broken line 22 in FIG. 6, this line being a virutal one only for explanatory purposes; followed by a second sub-step (or supplementary step) in which the configuration of tracks is completed at least in the zone where they lie side by side on the bottom of the cavity, carried out by an etching treatment with a fixed or mobile laser beam. A mobile beam may be obtained by means of a YAG laser with infrared radiation which permits of a removal rate of 3 m/s. It is also possible to use an optical pumped krypton-fluorine laser which emits ultraviolet radiation and which projects the static image of the structure of tracks to be realized on the bottom of the cavity 5 by means of an adapted optical system. This latter laser is capable of lifting off 1 μm of metal thickness per pulse from the entire surface to be treated through pulsatory action.

Figure 8:
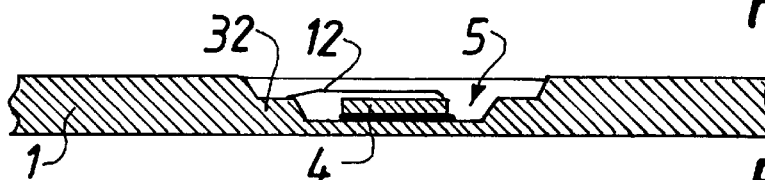
FIGS. 7 and 8 show a second embodiment of the invention in the same way as FIGS. 4 and 5, respectively.
Figure 7:
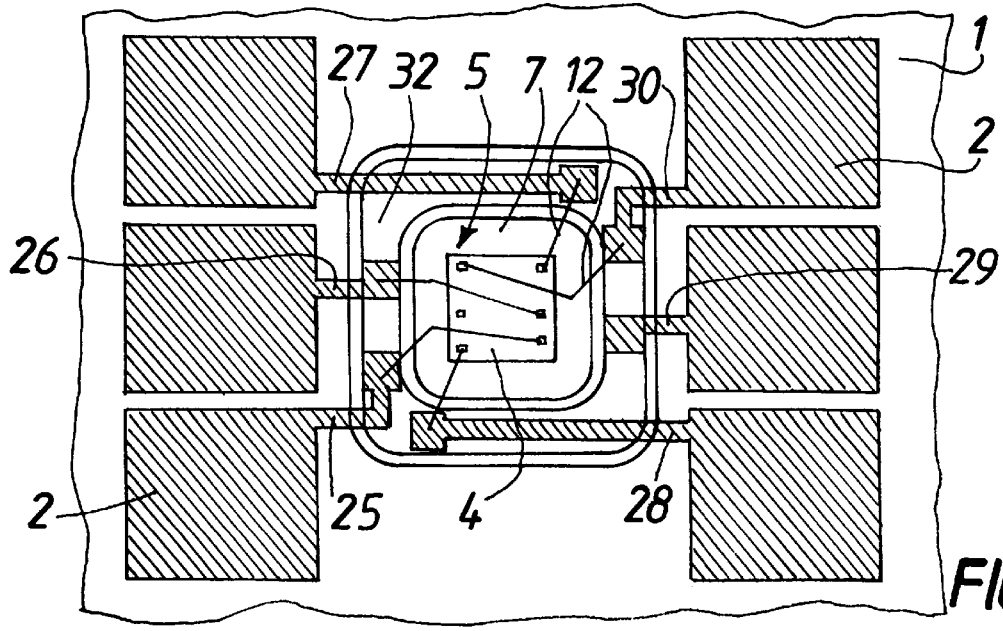

The second embodiment of the invention shown in FIG. 7 and 8 may be suitable for an integrated circuit which has a ground plane on one surface and the other contacts on the opposite surface, or alternatively, as shown in FIGS. 7 and 8, an integrated circuit of which all contacts are situated at one and the same side.

In FIG. 7, the integrated circuit 4 occupies the same position as in FIG. 4, central and parallel with respect to other structures, and the tracks 25, 26, 27 situated on the left of the Figure are not laid side by side with the tracks on the right 28, 29, 30. Instead, three differences distinguish this technology from the known technology of FIG. 3, the first two being necessary and the third being optional. A first difference evident from FIG. 7 is that the ends of the tracks situated opposite one another on either side of the cavity bottom are offset in the direction of two diametrically opposed corners of the cavity bottom, i.e. in the Figure the region situated in the right-hand bottom corner for the metal tracks on the right and the region situated in the left-hand bottom corner for the metal tracks on the left, such that the ends of the tracks no longer are in axial symmetry, as in FIG. 3, but have a symmetry with respect to the center of the cavity instead. A second difference is that the electrical connections have an interdigital configuration above the surface of the integrated circuit 4 which carries the contacts. Soldering of the conductor wires realized in this way is fairly delicate because the pitch between adjacent conductors is reduced compared with that of FIG. 3; it may be necessary to bend the wire parallel to the plane of the card, while it is also preferable in general to avoid that the conductor is curved around the integrated circuit, as in FIG. 7, because this involves the risk of a contact being made between the conductor and the edge of the integrated circuit, which parasitic contact should be absolutely avoided. To reduce this latter risk of false contact, it is advantageous if the cavity in the body of the card comprises an intermediate ledge 32, see FIGS. 7 and 8, which is provided such that the ends of the conductor tracks are arranged on this intermediate ledge during the first step of the process, said ledge surrounding the integrated circuit in the third step during which the contacts of the integrated circuit and the ends of the conductor tracks find themselves substantially at the same level, at half the depth of the cavity 5, as is clearly depicted in FIG. 8. This latter characteristic of the card of FIG. 7 forms the third difference, which is optional but preferable, between FIGS. 3 and 7.

Various known techniques are available to those skilled in the art for realizing the various steps in the process. It suffices below to indicate which are the preferred techniques.

The support 1 with its cavity 5 is preferably realized by injection-moulding of a thermoplastic material such as ABS or, preferably, polycarbonate (PC), which has a better temperature resistance. A polycarbonate which may be chosen is LEXAN HF 1110R manufactured by General Electric. It is also possible to use ABS-PC composites such as CYCOLOY C 1100 HF from General Electric, or high-temperature polyesters such as, for example, Eastalloy DA003 from the American company of Eastman Chemicals. It is to be noted that the temperatures necessary for hot moulding and wire soldering may be considerably in excess of 100° C. while remaining compatible with the plastic supports used as long as the time of actual exposure to the operational temperature does not exceed a few seconds.

The MID process preferred for the first step of the process is the hot foil embossing process, i.e. a hot stamping process of a configuration of glued tracks. Reference may be made here to the contents of, for example, the Patent EP 0 063 347. Given a thermal cycle with a duration of the order of 2 s, a configuration of metal tracks of 12 to 70 μm thickness may be applied against the card support at the area of the cavity 5 whose shape is designed for this purpose, i.e. with walls preferably inclined at an angle of approximately 45°, while the application pressure is of the order of 80 N/mm² and the temperature of the order of 200° C. The hot embossing foils carrying the track configurations have a multilayer structure for this purpose: one or several layers of hot-curing glue (usually phenol-based) of 1 to 4 μm thickness, a copper layer which is fairly ductile and has a thickness of between 12and 35 μm, and possibly a tin or nickel layer of a few μm thickness. The portion of the foil which is not stamped may subsequently be removed by means of a reeling station with an adhesive tape.

To obtain a good ductility of the copper it is possible, if the support is made of polycarbonate, to carry out an annealing heat treatment at 140° C. for 30 min. An ABS support, on the other hand, is more temperature-sensitive, and would not withstand this operation, so that it is necessary in this case to use copper for the application of the tracks which is already ductile. The hot foil embossing of the conductor tracks can be well integrated into an assembly line of electronic cards.

It is also possible to use a printing process for the first step followed by a metallization through autocatalysis. A lacquer containing palladium may be imprinted on the card support 1, against the walls and the bottom of the cavity 5, and around the latter on the surface 3 in the printing process with a cycle time of 2 s, subject to the pattern required for the configuration of metal tracks to be created in these locations. The printing quality is good, so that it is possible in this way to obtain a precision of the order of 50 μm for the width of the conductor tracks as well as for the distances separating the tracks.

The lacquer containing Pd, which forms a catalyst and is deposited in locations earnmarked for metallization on the support 1, is subsequently heated to 100° C. Then a metallization (copper or nickel) through autocatalysis is carried out, which operation has been known and practiced for a long time: the copper (or nickel) is deposited on the support 1 exclusively in locations where the catalyst is present. The thickness of the deposited copper lies between 1 and 10 μm. The main advantage of this electrochemical process of metallization is that several thousands to several tens of thousands of cards may be processed simultaneously, immersed together in one and the same bath, in no more than a few hours.

The glues which may be used for the second step of gluing the integrated circuit to the bottom of the cavity have already been indicated earlier.

The preferred wire soldering process for the third step in which the electrical connections are realized is the thermosonic process which uses gold wire of 25 or 32 μm in diameter. The actual operation should be carried out at a temperature of between 110° and160° C. when the support is made of polycarbonate, and of the order of 110° C. when it is made of ABS. Softening of the plastic must be avoided before the soldering operation so as to have available a stable support, which is indispensable to the establishment of good-quality connections. This softening could arise from the fact that it is desirable to preheat the support before the soldering itself because the plastic has a poor thermal conductivity. It should accordingly be heeded that the temperature given to the support does not exceed the glass transition temperature Tg which is between 120° and 140° C. for polycarbonate and between 80° and 100° C. for ABS. Furthermore, a local heating by means of a hot air jet applied locally to the integrated circuit and the metallizations may be carried out while the integrated circuit is being indexed into the soldering position, which renders it possible to reach the desired temperature during a very short period of the order of 60 to 100ms, during which the plastic does not have sufficient time to soften significantly even if its glass transition temperature should be reached.

The final assembling operation, i.e. the fourth step, consists in filling of the cavity 5 with a resin of very low viscosity, typically 300 to 7,000 mP.s, in a simple potting process. The resin used is preferably a resin of high ionic purity which provides a satisfactory resistance to the absorption of humidity and effectively protects the integrated circuit during bending and torsion of the card. When polymerized, the resin used for potting must have a certain flexibility, its hardness being 70 to 80 Shore D. Seveal resins known to those skilled in the art are suitable, which resins can be polymerized either under the influence of heat or under the influence of ultraviolet radiation.

As to the implementation of the second embodiment of the process as shown in FIGS. 7 and 8, it will be noted that there is no necessity in the second step to glue the integrated circuit to the center of the cavity or to arrange its edges parallel to metal pads. It is in fact possible to adopt an arrangement which is not central and/or not parallel, which could facilitate the interdigital arrangement of the conductor wires while avoiding in particular the necessity of bending them parallel to the plane of the card, or again if it is desired to avoid that the ends of the conductor tracks are to be offset too much relative to their highly symmetrical arrangement according to the prior art shown in FIG. 3. It will also be noted that gluing of the integrated circuit may be effected by means of a prepolymerizable glue through the application of an ultraviolet radiation immediately before gluing: this radiation activates a catalyst which in its turn triggers the curing reaction of the glue.

If the printing process is used for providing the conductor tracks, it is possible to realize plates comprising a comparatively great number of card supports by moulding, to provide the metallizations on these plates (first step), and subsequently separate the card supports by cutting of the plate.

We claim:

1. A method of manufacturing and assembling an electronic card comprising an electrically insulating card support provided with a cavity having a bottom and at least first and second opposing side walls, the cavity being provided in the card support for accommodating an integrated circuit defining first and second opposed sides, said integrated circuit having a first group of contacts which are provided on said first side and a second group of contacts which are provided on said first side and, said electrically insulating card support having on one surface metal contact pads electrically connected to respective contacts of said integrated circuit, said metal contact pads being respectively arranged in first and second groups adjacent the first and second side walls of said cavity, the method comprising the following steps:

a first step comprises providing electrical conductor tracks on the card support, each of said tracks being positioned against the bottom and a sidewall of said cavity and each of said tracks connected to one of said metal contact pads arranged on the surface of the support, the conductor tracks being provided so that each traverses the bottom of the cavity from one of said first and second side walls towards the other of said first and second side walls by more than half the dimension of the cavity defined by the first and second side walls, wherein said tracks connected to said first group of metal contacts pads alternate with said tracks connected to said second group of metal contact pads, a second step comprises gluing said second side of said integrated circuit, to the bottom of the cavity, wherein said first group of contacts on said integrated circuit are positioned adjacent said first group of metal contact pads and said second group of contacts on said integrated circuit are positioned adjacent said second group of metal contact pads, the integrated circuit being glued by means of non-conducting glue on a number of said tracks, a third step comprises soldering conductor wires between the contacts of the integrated circuit and ends of corresponding conductor tracks, the ends of said tracks connected to said first group of metal contact pads being connected to said second group of contacts on said integrated circuit and ends of said tracks connected to said second group of metal contact pads being connected to said first group of contacts of said integrated circuit, and a fourth step comprises filling the cavity with a protective resin which is subsequently polymerised.

2. The manufacturing and assembling process as claimed in claim 1, wherein the first step includes a step of completing a configuration of the tracks at least in a zone where they lie side-by-side, at the cavity bottom, by means of an etching operation with a fixed or mobile laser beam.

3. The manufacturing and assembling process as claimed in claim 1, wherein the first step further comprises cutting and gluing the tracks under hot pressure using a hot-curing glue.

4. The manufacturing and assembling process as claimed in claim 1, wherein the first step further comprises application by printing of a catalyst on the card support in a configuration corresponding to a desired physical arrangement for the tracks, followed by a metallization through autocatalysis.

* * * * *